United States Patent
Lucero

(10) Patent No.: US 7,602,666 B1
(45) Date of Patent: Oct. 13, 2009

(54) METHOD OF FORMING A UNIQUE NUMBER

(75) Inventor: Elroy Lucero, San Jose, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 12/335,163

(22) Filed: Dec. 15, 2008

Related U.S. Application Data

(62) Division of application No. 10/461,045, filed on Jun. 13, 2003, now Pat. No. 7,482,657.

(51) Int. Cl.
*G11C 5/14* (2006.01)

(52) U.S. Cl. .................... 365/226; 365/189.011

(58) Field of Classification Search ............. 365/226, 365/189.011
See application file for complete search history.

(56) References Cited

U.S. PATENT DOCUMENTS

| | | | |
|---|---|---|---|
| 4,939,567 A | 7/1990 | Kenney | |
| 5,571,745 A | 11/1996 | Horiuchi | |
| 5,635,744 A | 6/1997 | Hidaka et al. | |
| 5,907,503 A | 5/1999 | Kao et al. | |
| 6,161,213 A | 12/2000 | Lofstrom | |
| 6,229,182 B1 | 5/2001 | Van Lieverloo | |
| 6,235,583 B1 | 5/2001 | Kawata et al. | |
| 6,418,075 B2 * | 7/2002 | Shimano et al. | 365/227 |
| 6,501,138 B1 | 12/2002 | Karasawa | |
| 6,617,635 B2 | 9/2003 | Parekh et al. | |
| 2001/0043449 A1 | 11/2001 | Okushima | |
| 2003/0137017 A1 | 7/2003 | Hisamoto et al. | |
| 2003/0227059 A1 | 12/2003 | Miyake et al. | |

OTHER PUBLICATIONS

Elroy M. Lucero et al., Anti-Pirate Circuit for Protection Against Commercial Integrated Circuit Pirates, U.S. Appl. No. 10/383,416, filed Mar. 6, 2003.

* cited by examiner

*Primary Examiner*—Son Dinh
*Assistant Examiner*—Nam Nguyen
(74) *Attorney, Agent, or Firm*—Mark C. Pickering

(57) ABSTRACT

A unique number is formed with logic states from a static random access memory (SRAM), which is laid out to be balanced so that memory cells within the SRAM assume a non-random logic state when power is applied to the SRAM. The unique number is formed by grounding the word lines and bit lines before power is applied to the memory cells, applying power to the memory cells to assume the non-random logic state, reading the non-random logic states held by the memory cells, and forming the unique number from the logic states read from the memory cells.

14 Claims, 5 Drawing Sheets

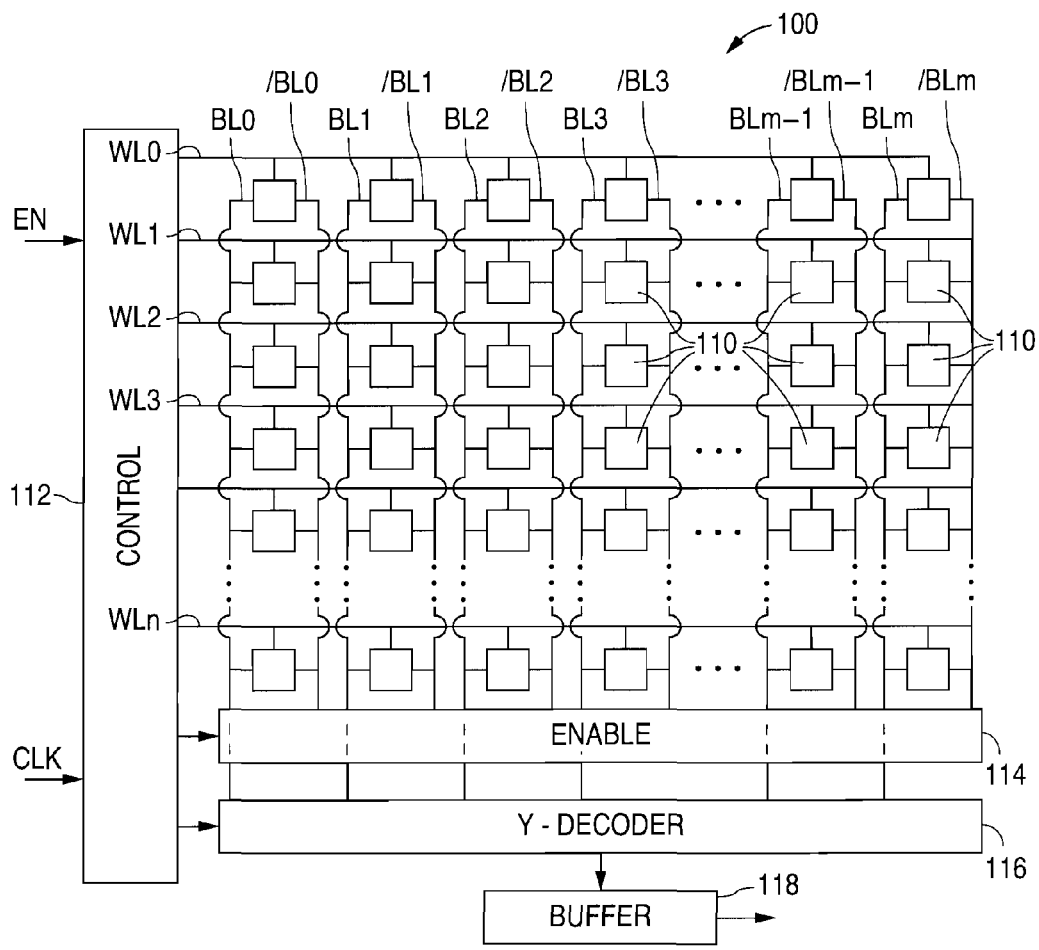
FIG. 1

METHOD OF FORMING A UNIQUE NUMBER

This is a divisional application of application Ser. No. 10/461,045 filed on Jun. 13, 2003, now U.S. Pat. No. 7,482,657, issued on Jan. 27, 2009.

BRIEF DESCRIPTION OF THE DRAWINGS

FIG. 1 is a schematic diagram illustrating an example of a static random access memory (SRAM) 100 in accordance with the present invention.

FIGS. 5A-5C are a series of timing diagrams illustrating the read operation of memory 100 in accordance with the present invention.

DETAILED DESCRIPTION OF THE INVENTION

FIG. 1 shows a schematic diagram that illustrates an example of a static random access memory (SRAM) 100 in accordance with the present invention. As shown in the FIG. 1 example, SRAM 100 includes a number of SRAM cells 110 that are formed in rows and columns as an array.

Figure 2:
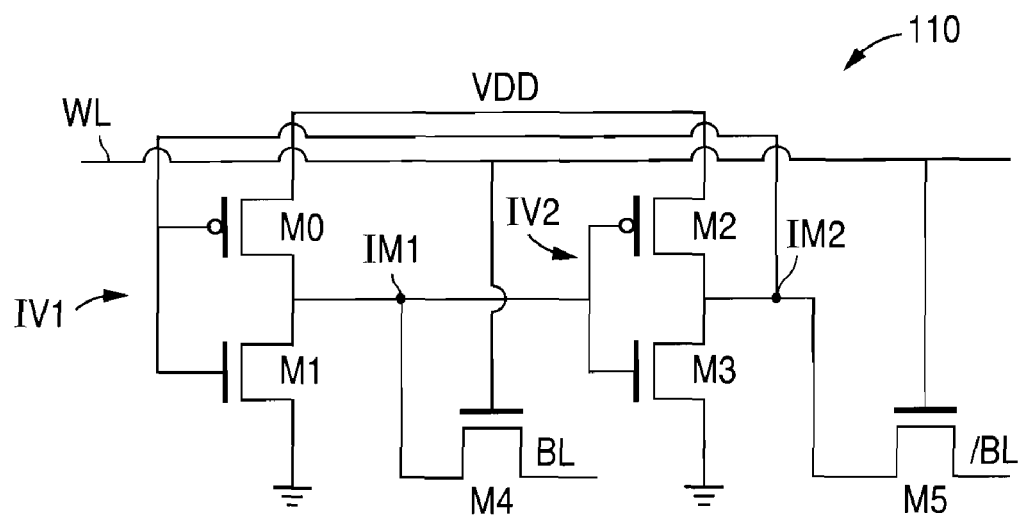
FIG. 2 is a circuit diagram illustrating an example of SRAM cell 110 in accordance with the present invention.

FIG. 2 shows a circuit diagram that illustrates an example of SRAM cell 110 in accordance with the present invention. As shown in FIG. 2, SRAM cell 110 includes a first inverter IV1 which has a PMOS transistor M0 and an NMOS transistor M1. Transistor M0 has a source connected to a power supply voltage VDD, a drain connected to an intermediate node IM1, and a gate. Transistor M1 has a source connected to ground, a drain connected to intermediate node IM1, and a gate connected to the gate of transistor M0.

As further shown in FIG. 2, SRAM cell 110 includes a second inverter IV2 which has a PMOS transistor M2 and an NMOS transistor M3. Transistor M2 has a source connected to the power supply voltage VDD, a drain connected to an intermediate node IM2, and a gate. Transistor M3 has a source connected to ground, a drain connected to intermediate node IM2, and a gate connected to the gate of transistor M2.

Inverters IV1 and IV2 are cross coupled such that the voltage on the output of inverter IV1 (intermediate node IM1) sets the voltage on the input of inverter IV2 (the gates of transistors M2 and M3), while the voltage on the output of inverter IV2 (intermediate node IM2) sets the voltage on the input of inverter IV1 (the gates of transistors M0 and M1).

As a result of being cross coupled, the output of inverter IV1 is stable at only one of two states, a logic high or a logic low, because the operation of the cross coupled inverters forces the output of inverter IV1 to one of the two logic states and the output of inverter IV2 to the opposite logic state. The output of inverter IV1 is not stable at voltages that lie between the logic high and logic low states, and always stabilizes at one of the two stable states.

For example, if the voltage on intermediate node IM1 is slightly greater than the voltage on intermediate node IM2, the slightly greater voltage on node IM1 turns on transistor M3 more than transistor M2, thereby pulling down the voltage on intermediate node IM2. At the same time, the slightly lower voltage on node IM2 turns on transistor M0 more than transistor M1, thereby pulling up the voltage on intermediate node IM1.

As the voltage on intermediate node IM1 rises, transistor M3 is turned on more and more while transistor M2 is turned off more and more. Similarly, as the voltage on intermediate node IM2 falls, transistor M0 is turned on more and more while transistor M1 is turned off more and more.

Eventually, transistor M3 is fully turned on and transistor M2 is fully turned off, thereby pulling the voltage on node IM2 to the logic low state. Similarly, transistor M0 is fully turned on and transistor M1 is fully turned off, thereby pulling the voltage on node IM1 to the logic high state. Thus, when the voltage on node IM1 is slightly higher than the voltage on node IM2, the output of inverter IV1 stabilizes to a logic high (while the output of inverter IV2 stabilizes to a logic low).

SRAM cell 110 also includes a first access transistor M4 and a second access transistor M5. Transistor M4 has a first terminal connected to intermediate node IM1, a second terminal, and a gate connected to a word line WL. Transistor M5 has a first terminal connected to intermediate node IM2, a second terminal, and a gate connected to word line WL.

Figure 3A:
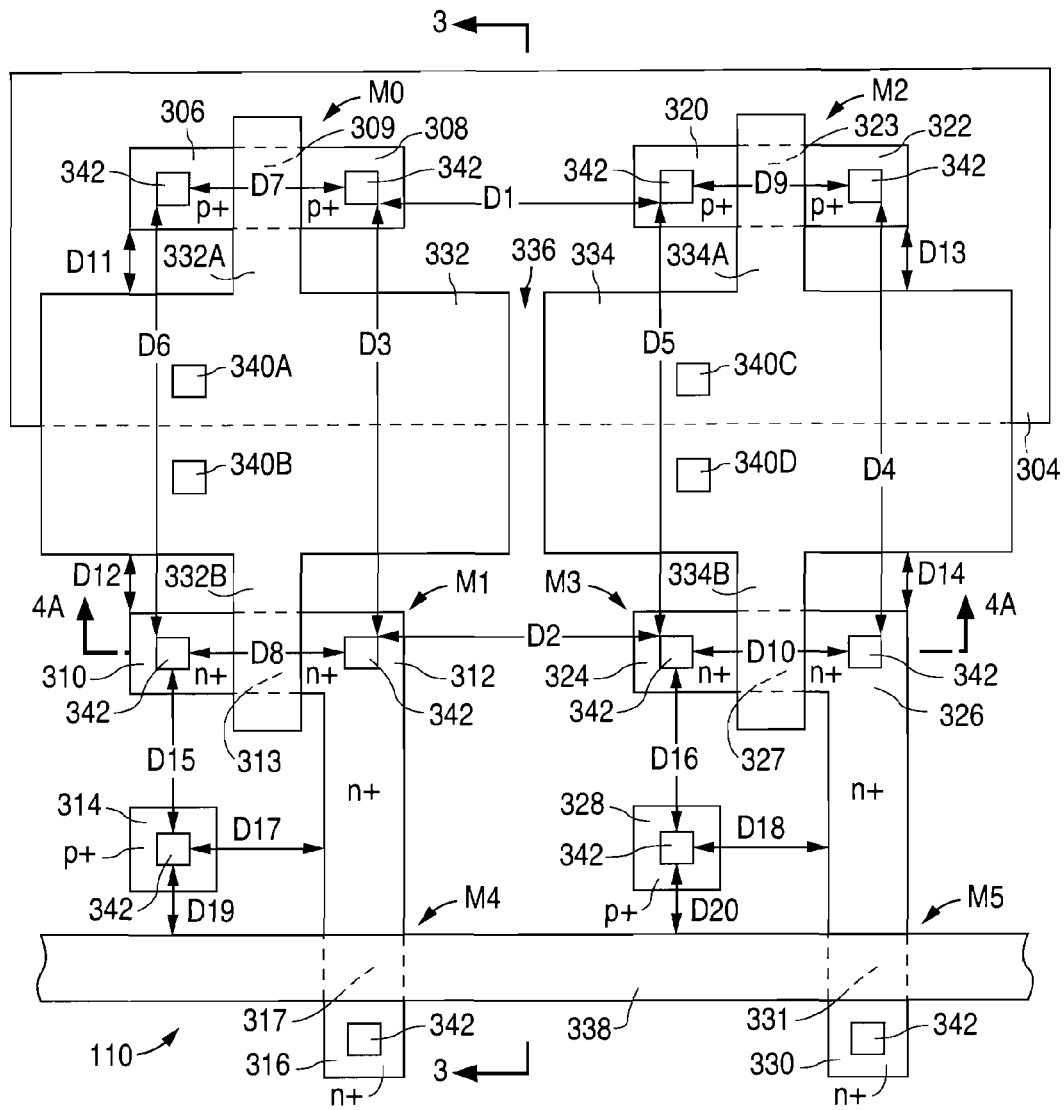
FIGS. 3A-3C are a series of plan views illustrating an example of a layout of SRAM cell 110 in accordance with the present invention.
Figure 4A:
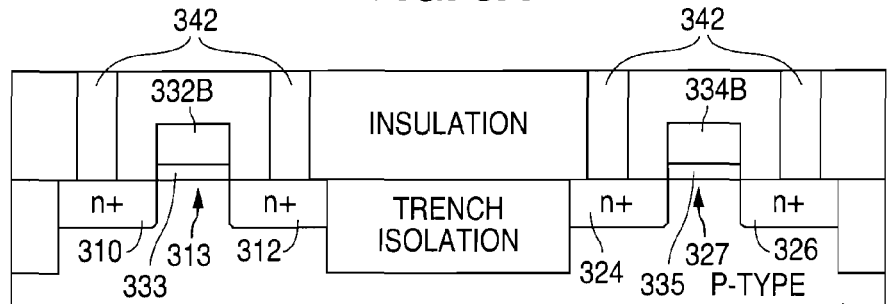
FIGS. 4A-4C are a series of cross-sectional views taken along lines 4A-4A through 4C-4C of FIGS. 3A-3C, respectively.
Figure 3B:
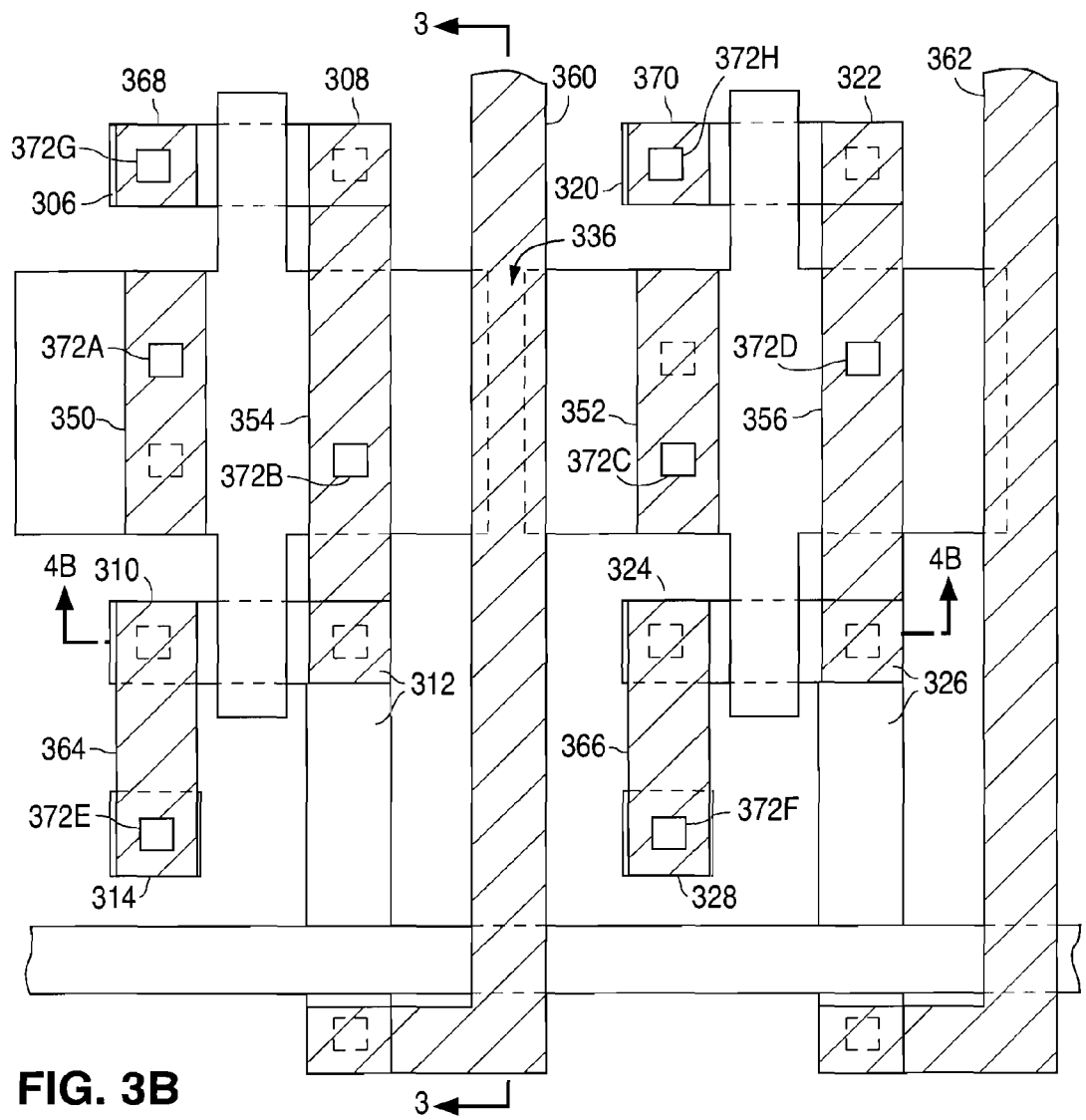
Figure 4B:
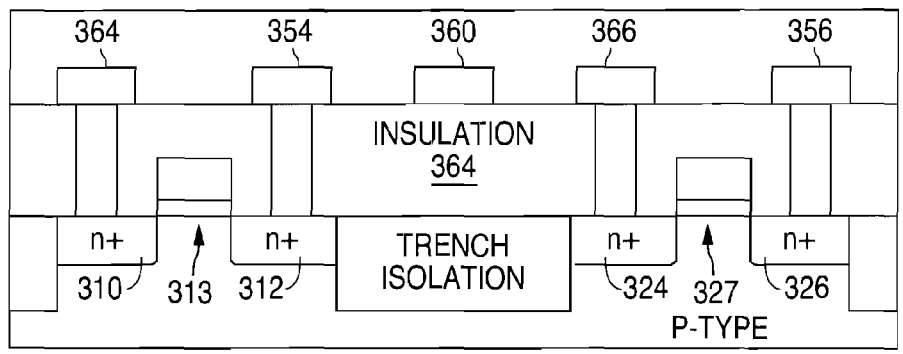
Figure 3C:
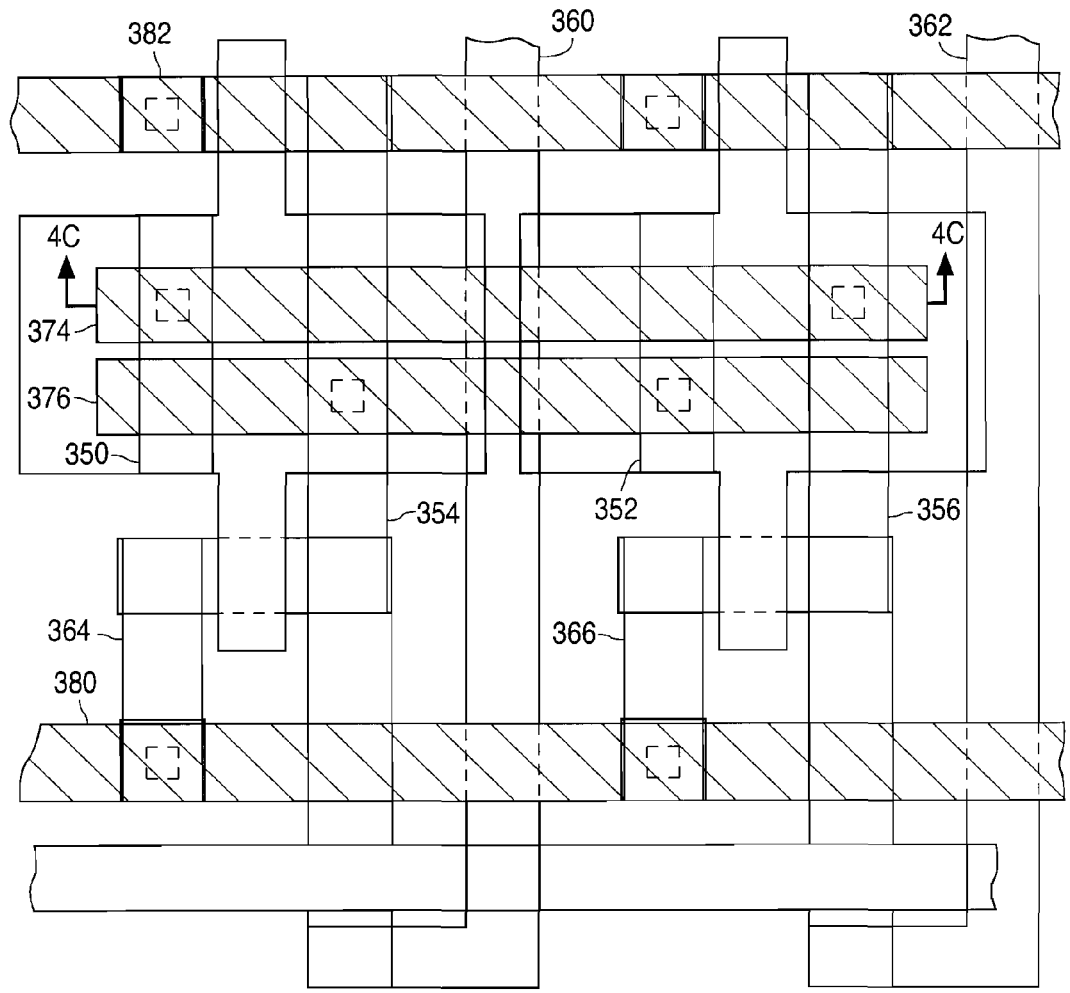
Figure 4C:
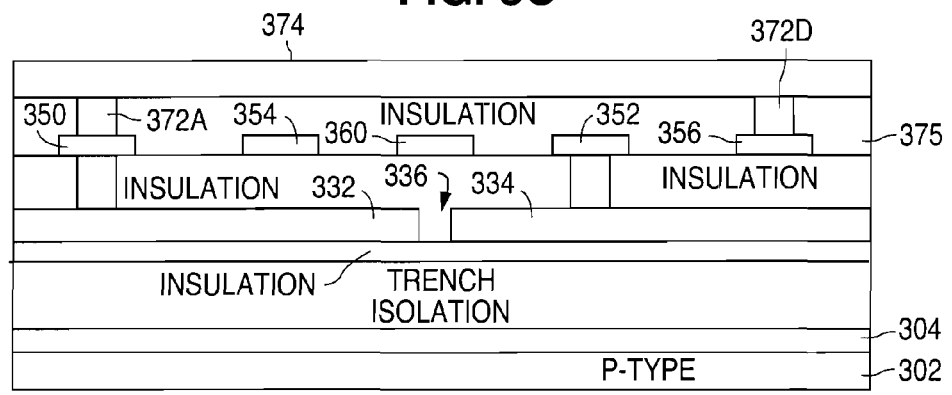

FIGS. 3A-3C show a series of plan views that illustrate an example of a layout of SRAM cell 110 in accordance with the present invention. FIGS. 4A-4C show a series of cross-sectional views taken along lines 4A-4A through 4C-4C of FIGS. 3A-3C, respectively. As shown in FIGS. 3A and 4A, cell 110, which is formed in a p-type semiconductor material 302, includes an n-well 304 that is formed in p-type material 302.

In addition, cell 110 includes a p+ region 306 and a p+ region 308 that are formed in well 304 on opposite sides of an n-type channel region 309 to form the source, drain, and channel regions of PMOS transistor M0. Cell 110 also includes an n+ region 310 and an n+ region 312 that are formed in material 302 on opposite sides of a p-type channel region 313 to form the source, drain, and channel regions of transistor M1.

A p+ region 314 is also formed in material 302 as a contact region. An n+ region 316 is formed in material 302 adjacent to a p-type channel region 317 where n+ region 312, channel region 317, and n+ region 316 form the first terminal, channel, and second terminal of access transistor M4.

As further shown in FIG. 3A, a p+ region 320 and a p+ region 322 are formed in well 304 on opposite sides of an n-type channel region 323 to form the source, drain, and channel regions of PMOS transistor M2. Cell 110 also includes an n+ region 324 and an n+ region 326 that are formed in material 302 on opposite sides of a p-type channel region 327 to form the source, drain, and channel regions of transistor M3. A p+ region 328 is also formed in material 302 as a contact region. An n+ region 330 is formed in material 302 adjacent to a p-type channel region 331 where n+ region 326, channel region 331, and n+ region 330 form the first terminal, channel, and second terminal of access transistor M5.

In addition, cell 110 includes a region of polysilicon 332 that is formed over, and isolated from, material 302 and well 304. Polysilicon region 332 includes a first finger 332A that extends away from region 332 between p+ regions 306 and 308 to form the gate of transistor M0, and a second finger 332B that extends away from region 332 between n+ regions 310 and 312 to form the gate of transistor M1. As shown in FIG. 4A, second finger 332B is isolated from material 302 by gate oxide region 333.

A polysilicon region 334, which is separated from polysilicon region 332 by a region of isolation material 336, is formed over, and isolated from, material 302 and well 304. Polysilicon region 334 includes a first finger 334A that extends away from region 334 between p+ regions 320 and 322 to form the gate of transistor M2, and a second finger 334B that extends away from region 334 between n+ regions 324 and 326 to form the gate of transistor M3. As shown in FIG. 4A, second finger 334B is isolated from material 302 by gate oxide region 335. Further, a strip of polysilicon 338 is formed over, and isolated from, material 302 between regions 312 and 316, and between regions 326 and 330, to form the gates of access transistors M4 and M5.

Cell 110 additionally includes a number of gate contact regions. A contact region 340A contacts polysilicon region 332 to make an electrical connection with region 332, and a contact region 340B contacts polysilicon region 332 to make an electrical connection with region 332. A contact region 340C contacts polysilicon region 334 to make an electrical connection with region 334, and a contact region 340D contacts polysilicon region 334 to make an electrical connection with region 334.

Further, cell 110 includes a number of surface contact regions 342. A contact region 342 is formed to contact p+ region 306 to make an electrical connection with region 306, and a contact region 342 is formed to contact p+ region 308 to make an electrical connection with region 308. A contact region 342 is formed to contact n+ region 310 to make an electrical connection with region 310, and a contact region 342 is formed to contact n+ region 312 to make an electrical connection with region 312. A contact region 342 is formed to contact p+ region 314 to make an electrical connection with region 314, and a contact region 342 is formed to contact n+ region 316 to make an electrical connection with region 316.

A contact region 342 is also formed to contact p+ region 320 to make an electrical connection with region 320, and a contact region 342 is formed to contact p+ region 322 to make an electrical connection with region 322. A contact region 342 is formed to contact n+ region 324 to make an electrical connection with region 324, and a contact region 342 is formed to contact n+ region 326 to make an electrical connection with region 326. A contact region 342 is formed to contact p+ region 328 to make an electrical connection with region 328, and a contact region 342 is formed to contact n+ region 330 to make an electrical connection with region 330.

In accordance with the present invention, the layout of this level of the left side of cell 110 (taken along line 3-3 of FIG. 3A) is intended to be exactly the same as the layout of the right side of cell 110. Thus, a distance D1 (from a point on the top surface of the contact region 342 connected to p+ region 308 to a closest point on the top surface of the contact region 342 connected to p+ region 320) is intended to be equal to a distance D2 (from a point on the top surface of the contact region 342 connected to n+ region 312 to a closest point on the top surface of the contact region 342 connected to n+ region 324).

Further, a distance D3 (from the point on the top surface of the contact region 342 connected to p+ region 308 to the point on the top surface of the contact region 342 connected to n+ region 312) is intended to be equal to a distance D4 (from a point on the top surface of the contact region 342 connected to p+ region 322 to a closest point on the top surface of the contact region 342 connected to n+ region 326).

Similarly, a distance D5 (from the point on the top surface of the contact region 342 connected to p+ region 320 to the point on the top surface of the contact region 342 connected to n+ region 324) is intended to be equal to a distance D6 (from a point on the top surface of the contact region 342 connected to p+ region 306 to a closest point on the top surface of the contact region 342 connected to n+ region 310).

In addition, distances D7, D8, D9, and D10 are intended to be the same, distances D11, D12, D13, and D14 are intended to be the same, distances D15 and D16 are intended to be the same, distances D17 and D18 are intended to be the same, and distances D19 and D20 are intended to be the same.

Further, the layout of p+ regions 306, 308, and 314 is intended to be the same as the layout of p+ regions 320, 322, and 328. The layout of n+ regions 310, 312, and 316 is intended to be the same as the layout of n+ regions 324, 326, and 330. The gate contacts 340 are intended to be the same, while the surface contacts 342 are also intended to be the same. In addition, the areas of the top surfaces of the contact regions 340 and 342 are intended to be the same.

In further accordance with the present invention, the source, drain, and channel regions of the transistors M0-M5 are intended to have the same size, be surrounded by an isolation region, such as trench or field isolation, and have the minimum geometry allowed by the fabrication process.

Referring to FIGS. 3B and 4B, cell 110 includes a metal-1 trace 350 that is connected to gate contacts 340A and 340B, and a metal-1 trace 352 that is connected to gate contacts 340C and 340D. A metal-1 trace 354 is connected to the contact region 342 connected to p+ region 308 and to the contact region 342 connected to n+ region 312, and a metal-1 trace 356 is connected to the contact region 342 connected to p+ region 322 and to the contact region 342 connected to n+ region 326.

As further shown in FIGS. 3B and 4B, a metal-1 trace 360 is connected to the contact region 342 connected to n+ region 316, and a metal-1 trace 362 is connected to the contact region 342 connected to n+ region 330. Metal-1 trace 360, which is formed on a layer of insulation material 364, is formed parallel to trace 354 over isolation region 336 between polysilicon regions 332 and 334 to form the bit line BL. Similarly, metal-1 trace 362 is formed parallel to trace 356 over an isolation region between polysilicon region 334 and the polysilicon region of an adjacent cell 110 to form the inverse bit line /BL.

A metal-1 trace 364 is connected to the contact region 342 connected to n+ region 310 and to the contact region 342 connected to p+ region 314, and a metal-1 trace 366 is connected to the contact region 342 connected to n+ region 324 and to the contact region 342 connected to p+ region 328. A metal-1 region 368 is connected to the contact region 342 connected to p+ region 306, and a metal-1 region 370 is connected to the contact region 342 connected to p+ region 320.

Cell 110 additionally includes a number of vias. A via 372A contacts metal trace 350 directly over the contact region 342 that contacts polysilicon region 332 to make an electrical connection with metal trace 350, and a via 372B contacts metal trace 354 over polysilicon region 332 to make an electrical connection with metal trace 354.

A via 372C contacts metal trace 352 directly over the contact region 342 that contacts polysilicon region 334 to make an electrical connection with metal trace 352, and a via 372D contacts metal trace 356 over polysilicon region 334 to make an electrical connection with metal trace 354.

A via 372E contacts metal trace 364 over the contact region 342 that contacts p+ region 314 to make an electrical connection with metal trace 364, and a via 372F contacts metal trace 366 over the contact region 342 that contacts p+ region 328 to make an electrical connection with metal trace 366. A via 372G contacts metal region 368 directly over the contact region 342 that contacts p+ region 306 to make an electrical connection with metal region 368, and a via 372H contacts metal region 370 directly over the contact region 342 that contacts p+ region 320 to make an electrical connection with metal region 370.

In accordance with the present invention, with the exception of vias 372A-372D, the layout of this level of the left side of cell 110 (taken along line 3-3 of FIG. 3B) is intended to be exactly the same as the layout of the right side of cell 110. Thus, the lengths, widths, and depths of metal-1 traces 350 and 352 are intended to be equal, the lengths, widths, and depths of metal-1 traces 354 and 356 are intended to be equal, the lengths, widths, and depths of metal-1 traces 360 and 362 are intended to be equal, and the lengths, widths, and depths of metal-1 traces 364 and 366 are intended to be equal.

Referring to FIGS. 3C and 4C, cell 110 includes a metal-2 trace 374 that is formed over metal-1 traces 350, 352, 354, and 356, and isolated from the traces by an insulation layer 375. Metal-2 trace 374 is connected to vias 372A and 372D to electrically connect the gates of transistors M0 and M1 to the drains of transistors M2 and M3.

A metal-2 trace 376 is formed over metal-1 traces 350, 352, 354, and 356, and isolated from the traces by insulation layer 375. Metal-2 trace 376 is connected to vias 372B and 372C to electrically connect the gates of transistors M2 and M3 to the drains of transistors M0 and M1. Metal-2 traces 374 and 376 are intended to be equal in length, width, and depth. A metal-2 trace 380, which provides a ground connection, is connected to vias 372E and 372F, and a metal-2 trace 382, which provides a power connection, such as to 1.8V, is connected to vias 372G and 372H.

Thus, as shown in FIGS. 3A-3C and 4A-4C, cell 110 is laid out to have two identical halves up through the metal-1 layer to perfectly balance cell 110. In addition, cell 110 is further laid out to maintain this balance by minimizing the coupling influence from the vias and metal-2 traces. To this end, the polysilicon regions 332 and 334 are made to have large areas to shield material 302 and well 304 from the coupling influences of the vias and metal-2 lines.

Further, metal-1 trace (bit line BL) 360 is formed over the polysilicon regions 332 and 334 and the isolation gap 336 between polysilicon regions 332 and 334 to shield material 302 and well 304 from the coupling influence of the metal-2 lines. The lengths, widths, and depths of the metal-1 and metal-2 traces are also formed to be equal to provide equal capacitive effects, such as metal-2 traces 374 and 376.

Thus, cell 110 is laid out to be perfectly balanced. When perfectly balanced, a SRAM cell has no preferred logic state when power is applied to cell 110. As a result, when power is applied to a perfectly balanced SRAM cell, the logic state assumed by the SRAM cell is random.

In accordance with the present invention, although laid out to be perfectly balanced, cell 110 is formed such that normal process mismatches between devices are emphasized. For example, minimum overlaps are utilized such that the distance from a contact to the edge of a diffusion region, from a contact to a poly gate, and from a contact to the edge of a metal-1 trace is the minimum allowed by the fabrication process.

In addition, as noted above, the transistors M0-M5 are laid out to have the minimum size allowed by the fabrication process and be surrounded by an isolation region. Further, the metal-1 lines are formed to have minimum widths. (The metal-2 lines 374 and 376 are formed to be wider than the minimum.) The mismatches introduced by the fabrication process, in turn, change the random logic state of a balanced SRAM cell into a non-random state.

Thus, although cell 110 is laid out to be balanced and thereby assume a random state when power is applied, cell 110 is formed in a process that emphasizes random process variations which cause cell 110 to assume a non random (the same) state when power is applied.

Each cell 110 in an array, however, does not stabilize to the same logic state, but stabilizes to a logic state that is defined by the particular process variations that effect the cell. In this way, some cells 110 in the array stabilize to a logic low state while other cells in the array stabilize to a logic high state. Whatever logic state the cells assume, however, remains the same.

Returning to FIG. 1, SRAM 100 includes a series of bit lines BL0-BLm that contacts the cells 110 such that a bit line BL is connected to the second terminal of transistor M4 in each cell 110 in a column of cells, and a series of bit lines /BL0-/BLm that contacts the cells 110 such that a bit line /BL is connected to the second terminal of transistor M5 in each cell 110 in a column of cells.

In addition, SRAM 100 includes a series of first source lines that contacts the cells 110 such that a first source line is connected to the sources of transistors M0 and M2 in each cell 110 in a row of cells, and a series of second source lines that contacts the cells 110 such that a second source line is connected to the sources of transistors M1 and M3 in each cell 110 in a row of cells. The first source lines are connected to the power supply voltage VDD to provide power to the cells 110, while the second source lines are connected to provide ground to the cells 110.

SRAM 100 also includes a series of word lines WL1-WLn that contacts the cells 110 such that a word line WL is connected to the gates of transistors M4 and M5 in each cell 110 in a row of cells. Further, memory 100 includes a control block 112 that is connected to the word lines WL1-WLn. Control block 112 includes a clock divider, an address counter, a row decoder, and control logic. In operation, control block 112 receives a clock signal CLK and a read enable signal EN.

Memory 100 additionally includes an enable block 114 that is connected to control block 112 and the bit lines BL0-BLm and BL0-/BLm, a Y-decoder 116 that is connected to control block 112 and the bit lines BL0-BLm via enable block 114, and a buffer 118 that is connected to Y-decoder 116.

In operation, SRAM 100 is initially without power. In this case, the voltages on all of the nodes of each cell 110 are equal to zero. As a result, SRAM 100 is a volatile memory that holds no information when power is absent. When power is applied, power is applied to control block 112, enable block 114, Y-decoder 116, and buffer 118.

Power, however, is not initially applied to the cells 110 in the array. Control block 112 detects the presence of power, initiates a timer, pulls each of the word lines WL0-WLn to ground, and outputs a control signal to enable block 114 which enables enable block 114, thereby causing enable block 114 to pull each of the bit lines BL0-BLm and /BL0-/BLm to ground.

Enable block 114 can be implemented with, for example, a number of transistors such that each bit line BL0-BLm and /BL0-/BLm is connected to ground via a transistor. In this example, the control signal received by enable block 114 from control block 112 turns on the transistors, thereby pulling each bit line BL0-BLm and /BL0-/BLm to ground.

When the timer expires, which indicates that each of the word lines WL0-WLn and each of the bit lines BL0-BLm and /BL0-/BLm have been pulled to ground, control block 112 outputs power to the cells 110 via the first source lines. Because the voltages on the sources of transistors M0 and M2 of each of the cells 110 are high and the voltages on the gates of transistors M0 and M2 of each of the cells 110 are low when power is first applied, transistors M0 and M2 initially turn on and begin sourcing current into intermediate nodes IM1 and IM2, respectively, of each of the cells 110.

As the voltages on intermediate nodes IM1 and IM2 rise, transistors M1 and M3 begin to turn on and sink current from nodes IM1 and IM2, respectively. Due to the mismatches introduced during the fabrication of the cells 110, transistor M0 or M2 sources slightly more current, and/or transistor M1 or M3 sinks slightly more current.

This leads to an imbalance which causes each cell 110 to assume one of the two logic states. By pulling each of the word lines WL0-WLn and each of the bit lines BL0-BLm and /BL0-/BLm to ground before power is applied to the cells 110, the word lines WL0-WLn and bit lines BL0-BLm and /BL0-/BLm exert no influence on which of the two logic states each cell 110 assumes when power is applied.

After power has been applied to the cells 110 in the array and the cells have assumed a logic state, the control signal output to enable block 114, which causes enable block 114 to pull each of the bit lines BL0-BLm and /BL0-/BLm to ground, is disabled. In the present example, this allows the voltages on the bit lines BL0-BLm to pass through enable block 114 to Y-decoder 116, while the bit lines /BL0-/BLm, which are only connected to ground via the transistors in enable block 114, are released from ground.

The pattern of logic states held by the cells is read out when control block 112 receives the read enable signal EN. To read the logic state held by a SRAM cell 110, a read voltage is placed on the word line WL that is connected to the cell 110. The read voltage is sufficient to turn on transistor M4 of the cell 110 to be read, along with transistor M4 of each remaining cell in the row. When each transistor M4 turns on, the voltage on the output of inverter IV1 (intermediate node IM1) of each cell 110 is placed on the bit line BL that is connected to the cell 110.

The voltages present on the bit lines BL are passed through enable block 114 to Y-decoder 116. Y-decoder 116 can be implemented with, for example, a number of transistors such that each transistor is connected between a bit line BL and buffer 118. To select only one of the bit lines, only one of the transistors is turned on at a time. As a result, buffer 118 receives the voltage from only one cell 110 at a time. Buffer 118 shifts the voltage out to device that generates a word that represents the values held by the cells 110.

FIGS. 5A-5C show a series of timing diagrams that illustrate the read operation of memory 100 in accordance with the present invention. As shown in FIGS. 5A-5C, assume a read operation is to be completed within a read time period defined by a read clock signal CLK. In this case, control circuit 112 utilizes a row clock signal CKR with a frequency that is n times greater than the read clock signal CLK such that there are n row clock periods in each read clock period. Control block 112 then utilizes the row clock signal CKR to sequentially enable each word line WL in the array.

For example, assume that the array of cells 110 includes 18 rows of cells, and the row clock signal CKR has 18 periods within each read clock period. In this case, control block 112 sequentially enables the word lines WL0-WL17 such that each of the 18 word lines WL is enabled within the read clock period.

Control circuit 112 also utilizes a column clock signal CKC with a frequency that is m times greater than the row clock signal CKR such that there are m column clock periods in each row clock period. Control block 112 then utilizes the column clock signal CKC to sequentially enable each bit line BL in the array.

For example, assume that the array of cells 110 includes 18 columns of cells, and the column clock signal CKC has 18 periods within each row clock period. In this case, control block 112 sequentially enables the bit lines BL0-BL17 via Y-decoder 116 such that each of the 18 bit lines BL is enabled within the row clock period.

Thus, the first word line WL0 is enabled, and then each bit line BL0-BLm is sequentially enabled. Following this, the second word line WL1 is enabled, and then each bit line BL0-BLm is sequentially enabled. This process continues until each cell 110 has been read. The output from each cell 110 is collected to form, from an 18×18 cell array, a 324-bit word.

In the preferred embodiment of the present invention, the outputs from the cells 110 in the first and last rows, and the first and last columns are ignored to further shield the remaining cells from influences outside of the array. Thus, an 18×18 array is read as a 16×16 array that outputs a 256-bit word.

Although each cell 110 on an individual chip stabilizes to a non-random logic state when power is applied due to the mismatches introduced by the fabrication process, the pattern of logic states that is held by the array is random from chip to chip. This is because the process variations, which change the random logic state assumed by a balanced cell to a non-random state, are random from chip to chip.

The non-random pattern can be used to generate a unique, permanent, nondeterministic number which can be used, among other things, to identify a chip during post wafer fabrication and provide security features to the chip. A portion of the number can also be hard programmed into a read-only-memory to supplement the identification.

Further, the process variations need not be sufficient to cause each and every cell to assume a permanent, non-random state when power is applied. A usable identification number can be obtained if, for example, 30 bits of a 256-bit array remain random because the process variations are insufficient.

Figure 6:
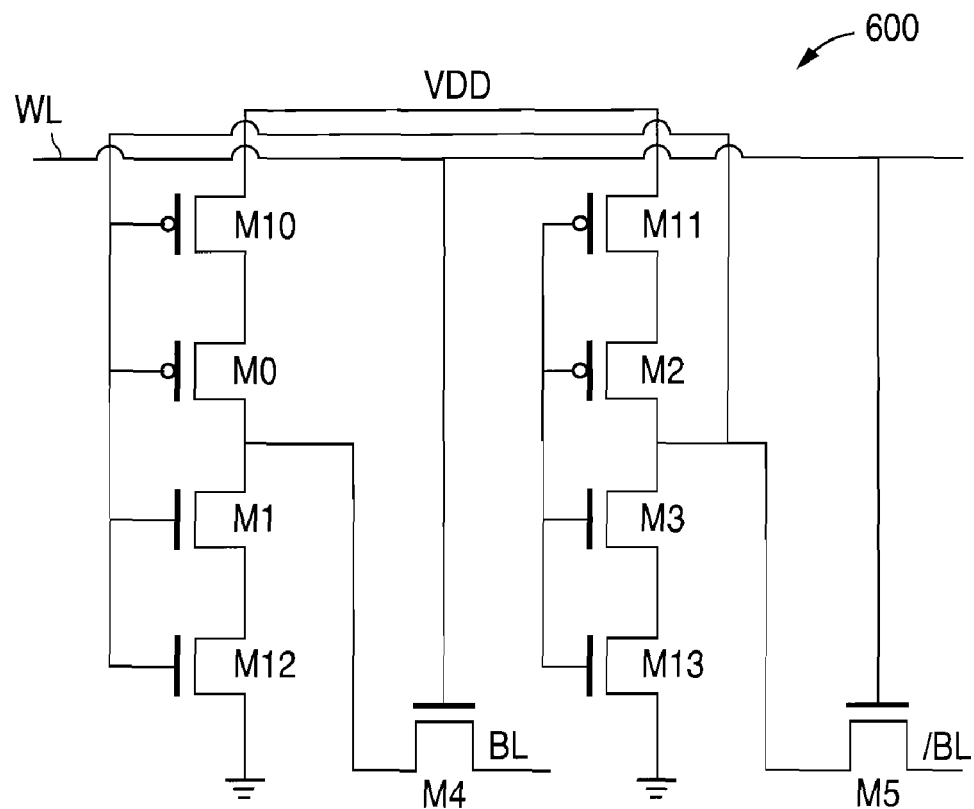
FIG. 6 is a circuit diagram illustrating an example of a SRAM cell 600 in accordance with the present invention.

FIG. 6 shows a circuit diagram that illustrates an example of a SRAM cell 600 in accordance with the present invention. SRAM cell 600 is similar to SRAM cell 110 and, as a result, utilizes the same reference numerals to designate the structures which are common to both cells. As shown in FIG. 6, SRAM cell 600 differs from SRAM cell 110 in that cell 600 includes PMOS transistors M10 and M11, and NMOS transistors M12 and M13.

PMOS transistor M10 is formed between PMOS transistor M0 and the power supply voltage VDD, while PMOS transistor M11 is formed between PMOS transistor M2 and the power supply voltage VDD. NMOS transistor M12 is formed between NMOS transistor M1 and ground, while NMOS transistor M13 is formed between NMOS transistor M3 and ground. SRAM cell 600 provides a greater opportunity for fabrication mismatches because cell 600 includes four more transistors than cell 110.

Thus, in accordance with the present invention, an array of SRAM cells are described where the cells are only read and data is never written into any of the cells. The cells are laid out as balanced cells, which have no preferred logic state when power is applied, and produce a non-random pattern due to fabrication mismatches which are random from chip to chip.

It should be understood that the above descriptions are examples of the present invention, and that various alternatives of the invention described herein may be employed in practicing the invention. For example, although the present invention reads only the bit lines of the cells, both the bit lines and inverse bits lines can also be read. Thus, it is intended that the following claims define the scope of the invention and that structures and methods within the scope of these claims and their equivalents be covered thereby.

What is claimed is:

1. A method of forming a unique number comprising:
   increasing a power supply voltage input to a first transistor and a second transistor in each memory cell of a plurality of memory cells from ground to an operating level, each memory cell assuming a logic state in response to the power supply voltage input to the first transistor and the second transistor being increased from ground to the operating level; and
   forming the unique number from a number of logic states held by a number of memory cells of the plurality of memory cells, each of the number of logic states being a logic state that was assumed in response to the power supply voltage input to the first transistor and the second transistor being increased from ground to the operating level.

2. The method of claim 1 wherein all voltages on all nodes within each memory cell are equal to ground before the power supply voltage input to the first transistor and the second transistor is increased from ground to the operating voltage.

3. The method of claim 2 wherein no logic state is written into any memory cell after a logic state has been assumed in response to the power supply voltage input to the first transistor and the second transistor being increased from ground to the operating level, and before the number of logic states are used to form the unique number.

4. The method of claim 2 wherein the plurality of memory cells are arranged in an array that includes a plurality of rows and a plurality of columns.

5. The method of claim 4 and further comprising reading the number of logic states from the number of memory cells before the unique number is formed.

6. The method of claim 5 wherein a logic state is read from each memory cell in the array.

7. The method of claim 6 wherein logic states read from a first row, a last row, a first column, and a last column of the array are dropped before forming the unique number.

8. The method of claim 2 wherein each memory cell assumes a non-random logic state in response to the power supply voltage input to the first transistor and the second transistor being increased from ground to the operating level.

9. The method of claim 2 wherein more than 20 and less than all memory cells assume a non-random logic state in response to the power supply voltage input to the first transistor and the second transistor being increased from ground to the operating level.

10. The method of claim 4 and further comprising grounding all word lines and all bit lines that are connected to a decoding circuit and the plurality of memory cells for a predetermined time before the power supply voltage input to the to the first transistor and the second transistor is increased from ground to the operating level.

11. The method of claim 10 wherein the predetermined time is measured by a timer.

12. The method of claim 10 wherein each word line is connected to a row of memory cells, and each bit line is connected to a column of memory cells.

13. The method of claim 12 wherein an access transistor in a memory cell is connected to a word line and a bit line.

14. The method of claim 13 wherein each memory cell is a static random access memory cell.

* * * * *